United States Patent
Delianides

(10) Patent No.: US 10,051,754 B2
(45) Date of Patent: Aug. 14, 2018

(54) TRAY OPERATING SYSTEM AND CORRESPONDING METHODS

(71) Applicant: Motorola Mobility LLC, Chicago, IL (US)

(72) Inventor: John Delianides, Westmont, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/277,884

(22) Filed: Sep. 27, 2016

(65) Prior Publication Data

US 2018/0092232 A1    Mar. 29, 2018

(51) Int. Cl.
| | |
|---|---|
| *H05K 7/00* | (2006.01) |
| *H05K 5/04* | (2006.01) |
| *H05K 7/14* | (2006.01) |
| *G06K 13/08* | (2006.01) |

(52) U.S. Cl.
CPC ............ *H05K 5/04* (2013.01); *G06K 13/0806* (2013.01); *H05K 7/1409* (2013.01)

(58) Field of Classification Search
CPC ..... H05K 5/04; H05K 7/1409; G06K 13/0806
USPC ................................................. 361/728, 737
See application file for complete search history.

(56) References Cited

U.S. PATENT DOCUMENTS

| | | | |
|---|---|---|---|
| 6,304,454 B1 | 10/2001 | Akamatsu et al. | |
| 6,609,936 B2 * | 8/2003 | Bricaud | H01R 13/635 439/108 |
| 6,890,203 B2 * | 5/2005 | Matsunaga | G06K 13/0862 139/326 |
| 7,766,678 B1 * | 8/2010 | Abe | H05K 5/0295 439/159 |
| 8,614,897 B2 * | 12/2013 | Tang | G06K 13/08 361/752 |
| 8,634,208 B2 * | 1/2014 | Duan | G06K 13/085 361/679.38 |
| 2015/0189774 A1 | 7/2015 | Sohn et al. | |
| 2017/0093057 A1 * | 3/2017 | Wang | H01R 12/52 |

OTHER PUBLICATIONS

SIM card reader design—Standard; Unknown Publication or Source; Unknown publication but believed to be prior to filing of present application.
"Photo", SIM card reader; Unknown Publication or Source; Labeled as Unknown Prior Art 1; Unknown publication but believed to be prior to filing of present application.
"Photo", SIM card reader; Unknown Publication or Source; labeled as Unknown Prior Art 2; Unknown publication but believed to be prior to filing of present application.

\* cited by examiner

*Primary Examiner* — Hung S Bui

(74) *Attorney, Agent, or Firm* — Philip H. Burrus, IV

(57) ABSTRACT

An assembly includes a housing having a major face, a first minor face extending distally from a first side of the major face, and a second minor face extending distally from a second side of the major face. The major face, the first minor face, and the second minor face define an opening of the housing. An extension member extends distally from the major face between the first minor face and the second minor face, and is folded back over an edge of the major face to define a load-bearing surface. A lever coupled to a tray can contact and roll along the load bearing surface in response to an applied force to eject the tray from the housing.

20 Claims, 6 Drawing Sheets

TRAY OPERATING SYSTEM AND CORRESPONDING METHODS

BACKGROUND

Technical Field

This disclosure relates generally to a tray and housing apparatus, and more particularly to an ejection system to remove the tray from the housing.

Background Art

Modern electronics frequently employ devices that slide into, or out of, a housing. For example, many modern electronic devices have slots and holes into which memory modules, subscriber identification modules, connectors, or other items can be inserted. The ability to accommodate such "slidable" devices enhances the operational performance of the device by allowing for improved configurability. Moreover, in many cases the service life of the device can be extended as well. Illustrating by example, when a mobile communication device has a slot into which a subscriber identification module can be inserted, a user can frequently switch service providers simply by inserting a new subscriber identification module. Rather than buying an entirely new device, the user simply swaps out the subscriber identification module.

Some modules slide into slots where they are retained by latches, springs, or other mechanisms. However, such modules must protrude from the device so the user can remove them. Other modules seat within a tray. Trays are beneficial because they allow the module to be fully seated within the device where they cannot be inadvertently removed from the device. Trays also facilitate the insertion and removal of modules while ensuring that the module is properly aligned with any internal connectors within the devices.

Prior art trays tend to make devices thicker than they otherwise would be if no tray were used. For instance, a tray requires a removal mechanism. Prior art removal mechanisms consume valuable internal volume, which results in a thicker form factor. It would be advantageous to have an improved tray operating system that allowed for a thinner form factor within an electronic device.

Figure 1:
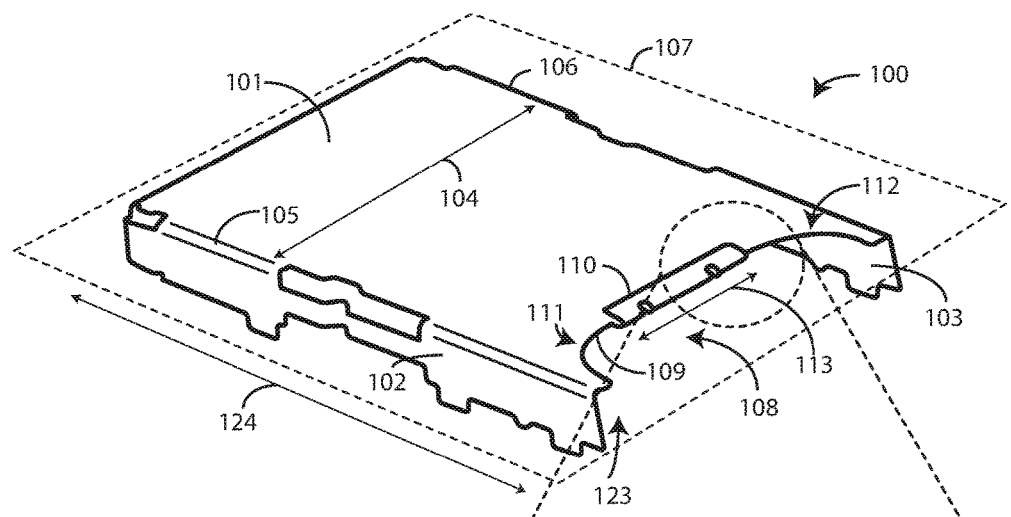
FIG. 1 illustrates one explanatory housing in accordance with one or more embodiments of the disclosure.
Figure 1:
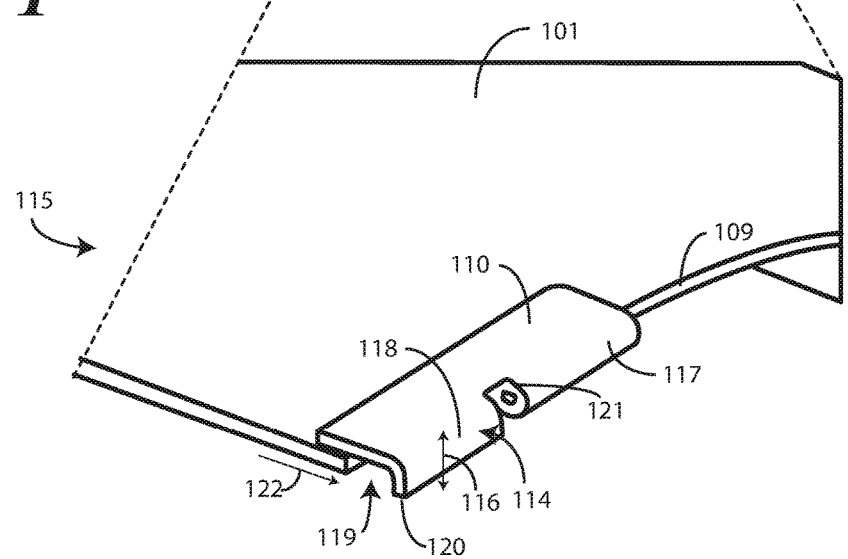

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure. The apparatus components and the method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of this disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a tray that can be used with an insertable module for an electronic device. Examples of such insertable modules include memory modules, subscriber identification modules, expansion cards, circuit cards, or other items. In one or more embodiments, the tray seats within a housing. The housing is uniquely configured with an extension member that extends distally from an edge of the top of the housing, which defines a major face of the housing. The extension member is folded back over the edge so as to define a load-bearing surface. In one or more embodiments, a lever is coupled to the tray with a hinge. When the lever is actuated, it pivots about the hinge away from an end of the tray. This pivoting causes a convex surface of the lever to roll along the load-bearing surface, thereby ejecting the tray from the housing.

Advantageously, by creating the load-bearing surface by bending the extension member back atop the housing, electronic devices employing embodiments of the disclosure can be manufactured with a thinner form factor. This is true because the lever can simply apply force to the load-bearing surface of the housing, rather than requiring an additional mechanical feature within the electronic device upon which the lever can operate. Said differently, the basic problem that embodiments of the disclosure solve is the ability to create a thinner electronic device by reducing the height of an ejection lever and by eliminating the need for additional mechanical features for the lever to operate. By allowing the lever to "push off" the module housing itself, the lever thickness can be made thinner. This allows for a smaller opening in the housing of the electronic device to be achieved, thereby resulting in a thinner overall electronic device.

With prior art tray-removal systems employing levers, a relatively thick lever operates by applying force to a wall extending from the housing of the overall device. Due to the fact that this wall is an extension from the electronic device's housing, the tolerances associated with such components are relatively quite variable. Accordingly, the lever needed to be even thicker to ensure that sufficient contact occurred with the wall to eject the tray.

In contrast to operating against a wall of the electronic device's housing, in one or more embodiments of the disclosure a thinner lever operates against a load bearing surface defined by an extension member extending from a module housing. Illustrating by example, in one or more embodiments the module is a subscriber identity module. The subscriber identity module seats within a tray. The tray then slides into a module housing, which is generally manufactured from metal (in contrast with the plastic or other materials that may be used for the electronic device).

In one or more embodiments, the metal subscriber identity module housing has an extension member extending from its top. The extension member is folded back over an edge of the top to define the load-bearing surface, which can be convex, partially planar, or take another shape. This "wrap around" metal feature acts as a load-bearing surface for the lever to act upon when removing the tray from the metal subscriber identity module housing. The load-bearing surface is thus formed on the subscriber identity module housing itself, thereby eliminating the need for a wall coupled to the electronic device housing. This allows for a thinner lever to be used.

In prior art designs where a plastic wall protruding from the electronic device housing is used, a thicker lever is required to make sufficient contact with the plastic wall. Additionally, clearance in the front surface of the electronic device housing is also required. Advantageously, simulation and other testing has shown that by forming a load bearing surface with an extension member extending from the module housing as described below allows for a reduction in the thickness of the lever by roughly 0.44 millimeters. This allows the opening in the housing of the electronic device to be reduced. This, in turn, allows for the overall thickness of the electronic device to be reduced. Other advantages will be obvious to those of ordinary skill in the art having the benefit of this disclosure.

Turning now to FIG. 1, illustrated therein is one explanatory housing 100 for a module configured in accordance with one or more embodiments of the disclosure. As noted above, the module can be any of memory modules, subscriber identification modules, expansion cards, circuit cards, or other items. Still other examples of modules suitable for use with embodiments of the disclosure will be obvious to those of ordinary skill in the art. For illustration purposes, the module used below will be that of a subscriber identity module. However, embodiments of the disclosure are not so limited.

In one or more embodiments, the housing 100 can be soldered or otherwise coupled to a circuit substrate so as to cover modules inserted therein. The housing 100 is suitable for use in many different types of electronic devices. Illustrating by example, the housing 100 can be used to receive subscriber identity modules in wireless communication devices such as smartphones, tablet computers, so called "phablets," personal digital assistants (PDAs), portable media players, e.g., MP3 players, electronic book readers, personal navigation devices, e.g., global-positioning-system (GPS) receivers, wearable electronic devices, such as devices worn with a wristband or armband, and so forth. Those of ordinary skill in the art having the benefit of this disclosure will understand that mobile communication devices are merely one type of electronic device for which the housing 100 is suited. Housings configured in accordance with one or more embodiments of the disclosure are certainly usable and compatible with any number of different structures and devices.

In one embodiment, the housing 100 is manufactured from a sheet metal frame. Metal is advantageous due to the fact that the module stowed within the housing 100 may require shielding from electromagnetic fields. For example, in one embodiment, the housing 100 can be machine formed from cold rolled steel. This steel can be coupled to a ground plane or other common node in an electronic device to provide shielding to a subscriber identification or other module stowed within the housing 100. In other embodiments, the housing 100 can be manufactured from cast metal. Other materials and methods of manufacture for the housing 100 will be obvious to those of ordinary skill in the art having the benefit of this disclosure.

Figure 6:
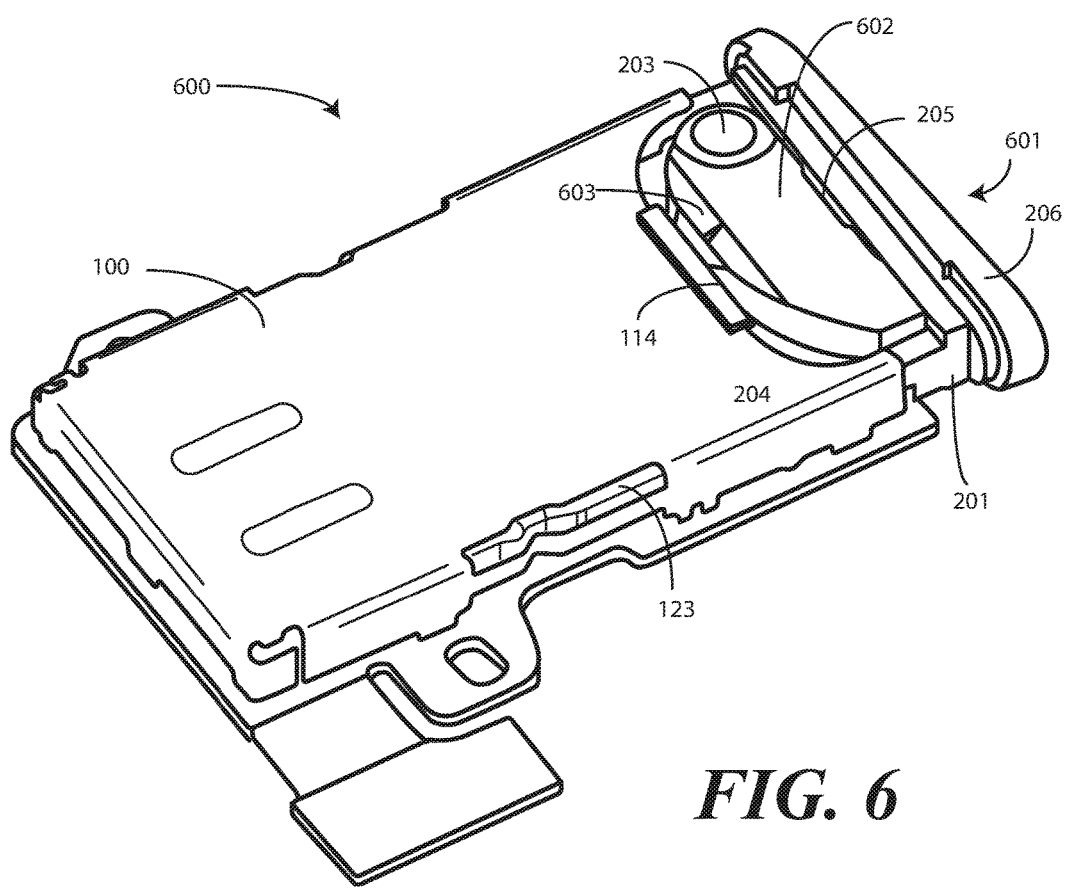
FIG. 6 illustrates one explanatory system in accordance with one or more embodiments of the disclosure in which a tray is fully inserted into a housing.
Figure 7:
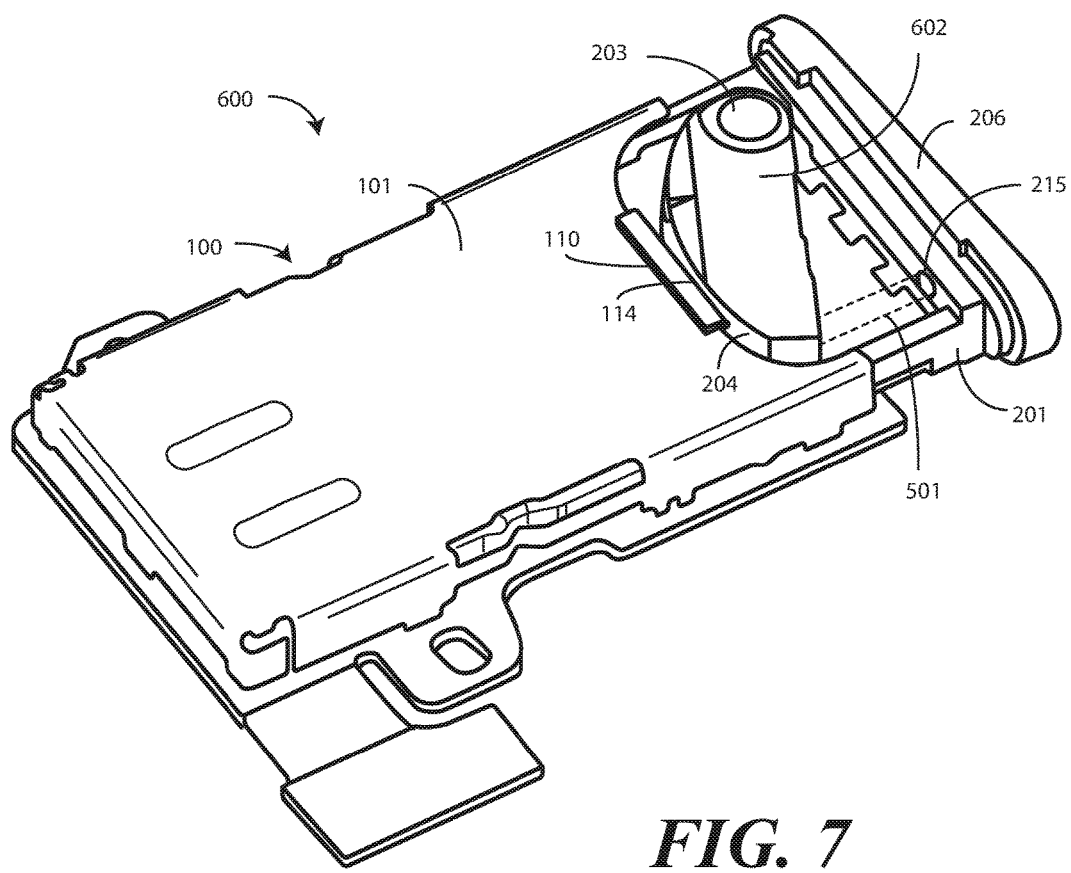
FIG. 7 illustrates one explanatory system in accordance with one or more embodiments of the disclosure in which a tray is being removed into a housing.

The housing 100 of FIG. 1 includes a major face 101, a first minor face 102, and a second minor face 103. A fourth minor face can be added to the rear of the housing as shown in FIGS. 6-7. In one or more embodiments, the major face 101 defines a width 104 of the housing 100. In one or more embodiments, the major face 101, the first minor face 102, and the second minor face 103 define an opening 108 of the housing 100 into which a module can be inserted.

In this illustrative embodiment, the first minor face 102 extends distally from a first side 105 of the major face 101. Similarly, the second minor face 103 extends distally from a second side 106 of the major face 101. In one or more embodiments the first minor face 102 extends distally from a first side 105 of the major face 101 at substantially an orthogonal angle relative to a reference plane 107 defined by the major face 101. Similarly, in one or more embodiments the second minor face 103 extends distally from a second side 106 of the major face 101 at substantially an orthogonal angle relative to the reference plane 107 defined by the major face 101.

In this illustrative embodiment the major face 101 terminates at an edge 109 located at the opening 108. In this illustrative embodiment, the edge 109 defines a concave curvature extending into the major face 101 that can be seen when the major face 101 is viewed in plan view.

In one or more embodiments, an extension member 110 extends distally from the edge 109 of the major face 101 between the first minor face 102 and the second minor face 103. In this illustrative embodiment, the extension member 110 is centrally located between a first quarter circle 111 of the edge 109 and a second quarter circle 112 of the edge 109. In one or more embodiments, the extension member 110 defines an extension member width 113 that is less than the width 104 of the housing 100.

In one or more embodiments, the extension member 110 is folded back over the edge 109 of the major face 101 to define a load-bearing surface 114. As shown in the exploded, sectional view 115 of FIG. 1, in this illustrative embodiment the load-bearing surface 114 extends beyond a perimeter of the major face 101 defined, in part, by the edge 109. This results in the load-bearing surface 114 being offset 122 from the edge 109 of the major face 101 in this illustrative embodiment.

In one or more embodiments, the extension member 110 initially extends distally from the major face 101 along the reference plane 107 defined by the major face 101. However, as noted above, the extension member 110 is then folded one or more times so as to extend back over at least a portion of the major face 101. In one or more embodiments, a reference tangent line 116 of the load-bearing surface 114 is oriented substantially orthogonally with the reference plane 107 defined by the major face 101 as shown in the exploded, sectional view 115 of FIG. 1.

The shape of the load-bearing surface 114 can take various forms. In one embodiment, the load-bearing surface 114 is convex, as shown at reference element 117. This convex shape can extend fully across the extension member width 113 in one or more embodiments.

Alternatively, in other embodiments, at least a portion of the load-bearing surface 114 can be planar, as shown at reference designator 118. This planar surface can be formed by cutting an aperture 119 in the extension member 110 and then bending an edge 120 of the aperture 119 back down after folding the extension member 110 back across the edge 109 of the major face 101.

In the illustrative embodiment of FIG. 1, both the convex and planar surfaces are used along the load-bearing surface 114. Illustrating by example, in this embodiment at least a portion, identified by reference element 117, is convex, while at least another portion, identified by reference designator 118, is substantially planar. In this illustrative embodiment, the load-bearing surface 114 defines at least one recess 121 that is disposed between the at least a portion and the at least another portion. Said differently, in this illustrative embodiment the load-bearing surface 114 defines at least one recess 121 between the convex portion of the load-bearing surface 114 and the substantially planar portion of the load-bearing surface 114. Other configurations for the load-bearing surface 114 will be obvious to those of ordinary skill in the art having the benefit of this disclosure.

In one or more embodiments, the major face 101, the first minor face 102, and the second minor face 103 define a cavity 123 of the housing 100. The cavity 123 can be configured to enclose electrical components or modules disposed beneath the housing 100. In this illustrative embodiment, the major face 101, the first minor face 102, and the second minor face 103 define a number of edges or segments defining a perimeter of the housing 100. In this illustrative embodiment, these segments comprise a plurality of substantially linear edges with radiused corners. Other edges will be obvious to those of ordinary skill in the art having the benefit of this disclosure.

In this illustrative embodiment, the first minor face 102 and the second minor face 103 define a plurality of sidewalls that extend substantially orthogonally from the major face 101 about the outer perimeter of the housing. Each sidewall includes proximal end disposed adjacent to the major face 101 and a distal end at which the sidewall terminates. In one or more embodiments, the length 124 and width 104 of the major face 101, which defines an upper surface of the housing 100, are substantially larger than the height of either the first minor face 102 or the second minor face 103, i.e., the distance between the proximal end and the distal end of each sidewall.

Figure 2:
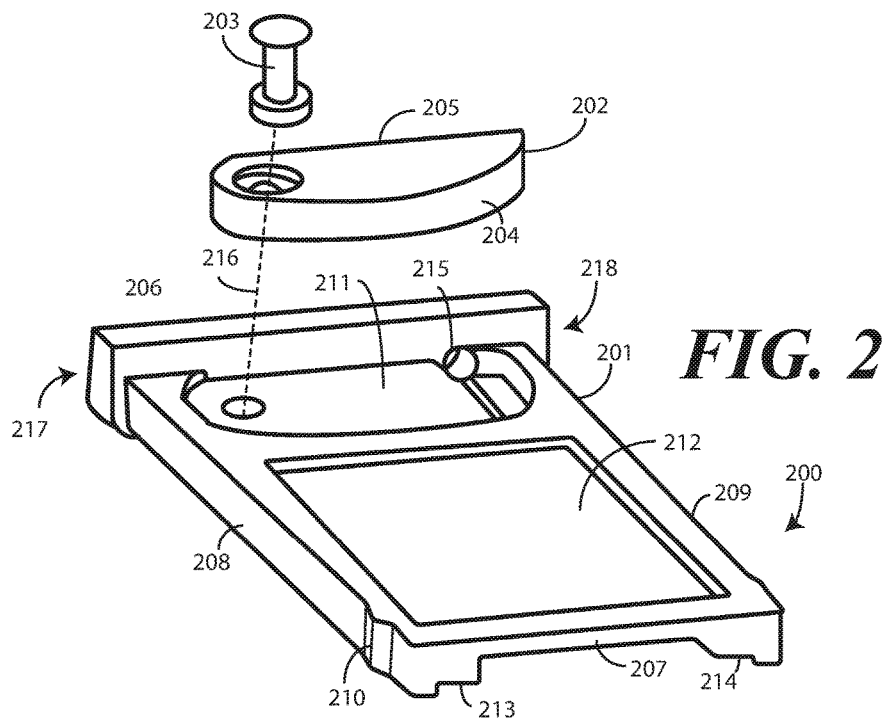
FIG. 2 illustrates explanatory components of one explanatory tray in accordance with one or more embodiments of the disclosure.
Figure 3:
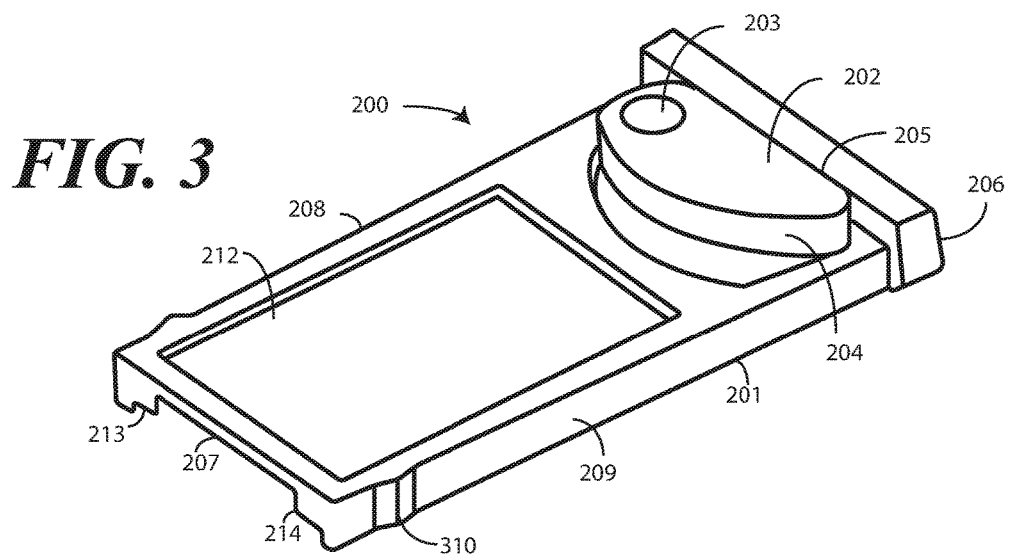
FIG. 3 illustrates on explanatory tray in accordance with one or more embodiments of the disclosure.

Turning now to FIGS. 2 and 3, illustrated therein is one explanatory tray 200 suitable for insertion into the cavity (123) of the housing (100) of FIG. 1. FIG. 2 illustrates the tray 200 in an exploded view so some of the components can be seen. FIG. 3 illustrates the tray 200 in an assembled view.

In one or more embodiments, the tray 200 is slideably removable from, for example, the housing (100) of FIG. 1.

In this illustrative embodiment, the tray 200 includes a tray bed 201, a lever 202, and a hinge 203. In this illustrative embodiment, the hinge 203 is disposed at a first side 217 of the first end 206 of the tray 200.

In one or more embodiments, the lever 202 comprises a rigid object that is manufactured as a separate piece from the tray bed 201, but that is attached to the tray bed 201 to facilitate ejecting the tray bed 201 from the housing (100) of FIG. 1. In one or more embodiments, the lever 202 is manufactured from plastic. Plastic is advantageous in that it does not interfere with the radiation patterns of wireless communication devices. As form factors for such devices become smaller, the use of materials that do not interfere with radiation patterns becomes a more important consideration. In alternate embodiments, however, the lever 202 may be constructed from any rigid or semi-rigid material.

In one embodiment, the lever 202 includes a front side 204 and a back side 205. In one or more embodiments, the back side 205 of the lever 202 defines a convex curvature. While a convex curvature is one contour suitable for the back side 205 of the lever 202, others can be used as well. For example, other curvatures, lines, and/or angles can be used for the back side 205 of the lever 202. The hinge 203 pivotally connects the lever 202 to the tray bed 201 in one or more embodiments.

In this illustrative embodiment, the tray bed 201 includes a front side 206, a back side 207, a left side 208, and a right side 209. In one or more embodiments, the left side 208 and the right side 209 can optionally define a left retention bump 210 and a right retention bump 310. These retention bumps can engage with complementary members in the housing (100) to retain the tray bed 201 within the housing (100) and prevent unintentional opening that may occur as a result of quick movements or a position in which a device with the tray bed 201 is held. In another embodiment, retention depressions replace the retention bumps.

The left side 208 and the right side 209 can further optionally define a first depression 211 to receive the lever 202. In this illustrative embodiment, the front side 206 defines an aperture 215, configured here as a through-hole, through which the back side 205 of the lever 202 can be accessed. In one or more embodiments, the aperture 215 is disposed at a second side 218 of the first side 206 of the tray 200. As will be described in more detail below with reference to FIG. 5, in one or more embodiments, a shaft can be inserted into the aperture 215 to pivot the lever 202 about the hinge 203.

In this illustrative embodiment, the left side 208 and the right side 209 also define a module receiving recess 212, a first rail 213, and a second rail 214. In one or more embodiments, the module receiving recess 212 is configured with dimensions suitable to act as a receiver to hold a subscriber identification module (SIM).

A reference axis 216 is shown as being substantially orthogonal with a plane defined by the front side 206, the back side 207, the left side 208, and the right side 209 of the tray bed 201. The hinge 203 can pivotally connect the lever 202 to the tray bed 201 along this reference axis 216 is one or more embodiments. In this illustrative embodiment, the hinge 203 comprises a pin that is fixed to the tray bed 201. The lever 202 can then rotate about the pin. However, it should be noted that the hinge 203 can take different shapes. For example, the hinge 203 can be of a cylindrical or a conical shape. Other shapes will be obvious to those of ordinary skill in the art having the benefit of this disclosure.

In this illustrative embodiment, the lever 202 is positioned within the first depression 211 of the tray bed 201. In one or more embodiments, the first depression 211 has an area that exceeds the area of a side of the lever 202 placed against the first depression 211. This extra area provides the lever 202 with room to rotate within the first depression 211 while keeping the lever 202 properly aligned within the tray bed 201.

In one or more embodiments, the amount that the lever 202 protrudes above the first depression 211 does not exceed the height of the front side 206 of the tray bed 201. As such, this allows the lever 202 to clear an opening within a device housing into which the tray bed 201 is inserted or removed. A smartphone, for example, may use the tray 200 for a slideably removable subscriber identification module card. Within the housing or shell of the smartphone is a cavity into which the tray 200 is inserted and removed. As the tray 200 is inserted into the smartphone, the front side 206 of the tray bed 201 can close the opening of the smartphone's housing by having a contour or shape that matches the contour or shape of the smartphone's opening. Thus, when the tray bed 201 is fully inserted, the front side 206 of the tray bed 201 can follow and match the contour or shape of the smartphone's housing in one or more embodiments.

In one or more embodiments, the tray bed 201 is slideably inserted within the cavity (123) of a housing (100) by the first rail 213 and second rail 214 formed on the underside of the left side 208 and the right side 209 of the tray bed 201, respectively. The rails can be configured to mate with adjacent structures disposed along a substrate to which the housing (100) is attached to allow the tray bed 201 to slide in and out of the device cavity on its rails.

Figure 4:
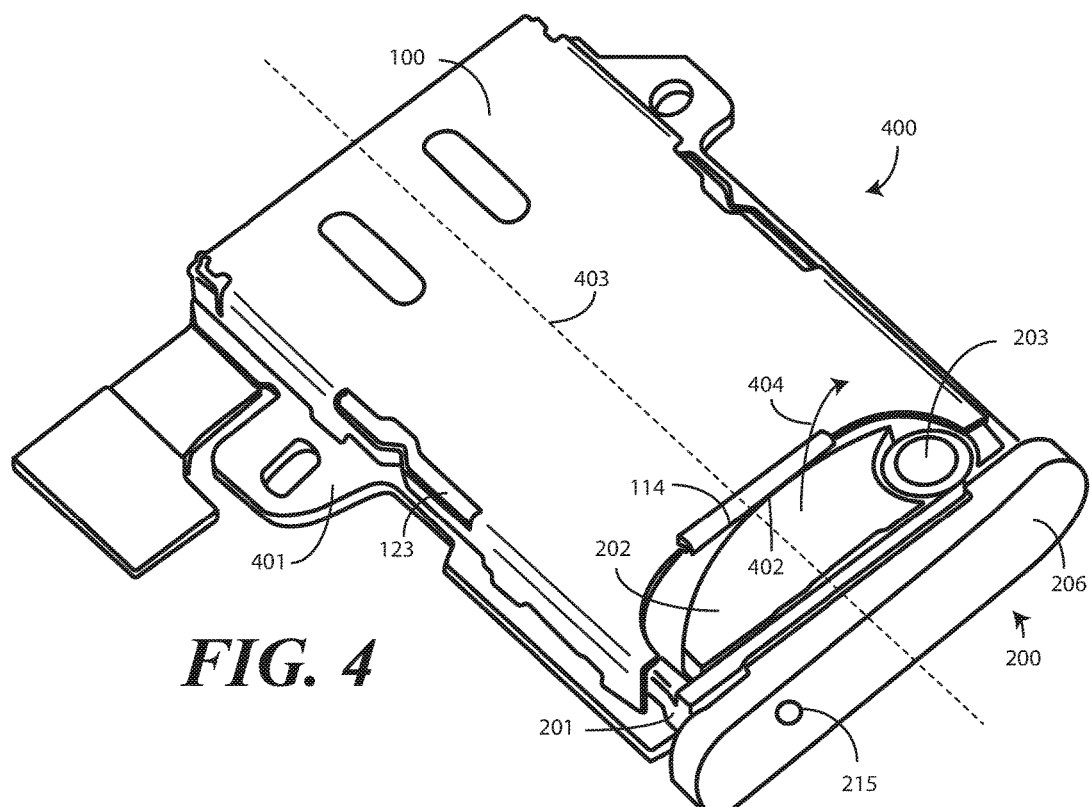
FIG. 4 illustrates one explanatory tray operating system in accordance with one or more embodiments of the disclosure.

Turning now to FIG. 4, illustrated therein is one explanatory assembly 400 including a housing 100 and tray 200 configured in accordance with one or more embodiments of the disclosure. As shown in FIG. 4, the housing 100 has been coupled to a circuit substrate 401. In this illustrative embodiment, the housing 100 has been soldered to exposed metal pads on the circuit substrate 401.

In FIG. 4, the tray bed 201 is fully inserted into the housing 100. This is referred to as the "closed" position for the tray bed 201. In one or more embodiments, to eject or otherwise withdraw the tray bed 201 from the housing 100, the lever 202 is configured to pivot 404 about the hinge 203 away from an end of the tray 200 against the load-bearing surface 114 to slideably remove the tray 200 from the cavity 123 of the housing 100. In one or more embodiments this is done by inserting a tool through the aperture 215 disposed in the first side 206 of the tray bed 201.

Figure 5:
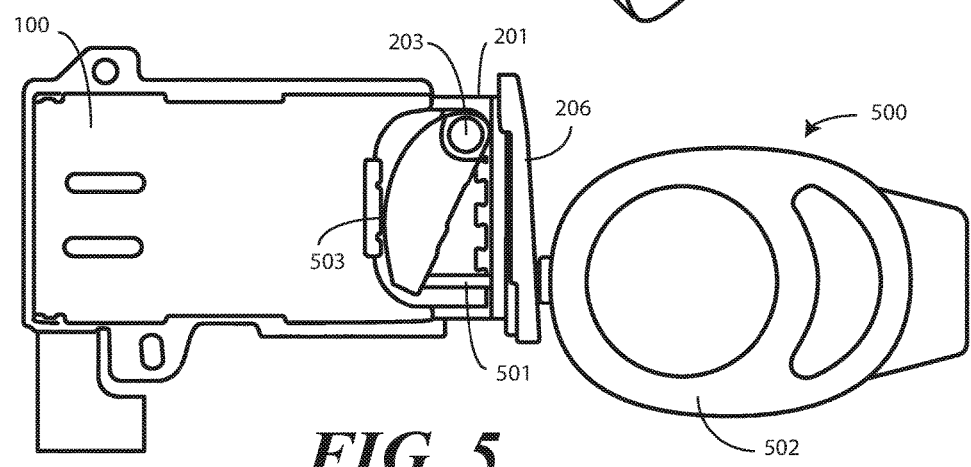
FIG. 5 illustrates operation of on explanatory tray operating system in accordance with one or more embodiments of the disclosure.

Turning now to FIG. 5, such a tool 500 is shown. In this illustrative embodiment, the tool 500 includes a shaft 501 and a graspable portion 502. In one or more embodiments, the tool 500 comprises an implement that is grasped at one end and includes a shaft 501 that is narrow enough to pass through the aperture 215 in the front side 206 of the tray bed 201 to actuate the lever 202 by applying a force against the lever 202. In FIG. 5, the tray bed 201 is sildably moved out from the housing 100 to a point where a user can grasp the first end 206 to fully remove the tray bed 201 from the housing 100. This is referred to as the "open" position for the tray bed 201.

Referring now to both FIGS. 4 and 5, illustrated therein are an initial fulcrum point 402 for the lever 202 when the tray bed 201 is in the closed position and another fulcrum point 503 for the lever 202 when the tray bed 201 is in the open position. A reference centerline 403, which represents two overlapping centerlines, one for the tray bed 201 and one for the lever 202, is also shown. The reference centerline 403 divides the lateral distance, i.e., the left-to-right distance, of the tray bed 201 and lever 202 into halves when the tray bed 201 is in the closed position.

The cavity 123 of the housing 100 defines a space, recess, or hollow formed within the housing into which the tray bed 201 is inserted and removed. When the tray bed 201 is in the closed position, the lever 202 rests against the load-bearing surface 114 of the housing 100 at the initial fulcrum point 402. The load-bearing surface 114 of the housing 100 is the surface against which the lever 202 operates to transition the tray bed 201 from the closed position to the open position.

The initial fulcrum point 402 is the location at which the lever 202 contacts the load-bearing surface 114 when the tray bed 201 is fully inserted into the cavity 123 in its closed position in one embodiment. In other embodiments where the lever 202 does not contact the load-bearing surface 114 in the closed position, the initial fulcrum point 402 is defined by the first point of contact between the lever and the load-bearing surface 114 when the shaft 501 of the tool 500 actuates the lever 202 by pushing the lever 202 toward the load-bearing surface 114 while the tray bed 201 is in its closed position.

Once the lever 202 contacts the load-bearing surface 114, a force is applied to the hinge 203 to push open the tray bed 201. As the tray bed 201 opens, the point of contact between the lever 202 and the load-bearing surface 114 transitions from the initial fulcrum point 402 to another fulcrum point 402. Where the back side of the lever 202 has convex curvature, the initial fulcrum point 402 transitions to the other fulcrum point 503 when the lever 202 rolls along the convex curvature against the load-bearing surface 114. Accordingly, in one or more embodiments the convex curvature is configured to roll along the load-bearing surface 114 when the lever 202 pivots about the hinge 203 away from the first end 206 of the tray bed 201.

Turning now to FIGS. 6 and 7, illustrated therein is another explanatory assembly 600 configured in accordance with one or more embodiments of the disclosure. As with the assembly (400) of FIGS. 4 and 5, this illustrative assembly includes a housing 100 and tray 601 configured in accordance with one or more embodiments of the disclosure. The tray 601 includes a tray bed 201 as previously described.

The difference between the tray 601 of FIGS. 6 and 7, when compared to the tray (200) of FIGS. 2 and 3, occurs with the lever 602. As before, the lever 602 is coupled to the tray bed 201 by a hinge 203. However, in this illustrative embodiment the lever 602 comprises a chamfer 603 disposed along the back side of the lever 602. In this illustrative embodiment, the chamfer 603 is centrally located along the convex curvature.

As previously described, in one or more embodiments, the assembly 600 can be incorporated into an electronic device, such as a smartphone. The housing or shell of the electronic device defines an aperture into which the tray 200 is inserted and removed. Advantageously, inclusion of the chamfer 603 helps to ensure that the lever 602 does not act as a mechanical stop against the sides of the aperture in the housing or shell of the electronic device to prevent the tray 200 from fully inserting into the device. As before, when the tray bed 201 is fully inserted, the front side 206 of the tray bed 201 can follow and match the contour or shape of the smartphone's housing in one or more embodiments.

As shown in FIG. 6, the lever 602 is positioned on a surface of the tray bed 201. The lever 602 is secured to the tray bed 201 using the hinge 203. The tray 601 is slideably insertable into the cavity 123 of the housing 100 as previously described. The tray bed 201 is in a closed position wherein the back side 205 of the lever 602 is positioned adjacent to the front side 206 of the tray bed 201.

In one or more embodiments, the back side 206 of the lever 602 conforms to a shape of the front side 206 of the tray bed 201, which, in turn, conforms to a shape of the device into which the assembly 600 is inserted. In this illustrative embodiment, the back side 205 of the lever 602 is substantially planar and conforms to the front side 206 of the tray bed 201. In other embodiments, the back side 205 of the lever 602 can be partially or fully non-planar and can include angles and/or curvature that can be concave and/or convex. For the embodiment shown in FIG. 6, the back side 205 of the lever 602 is substantially planar, and the front side 204 of the lever 602 has convex curvature. This however, is only one of many embodiments for which the front side 204 and back side 205 sides of the lever 602 can be of different shapes.

In one or more embodiments, the convex curvature of the front side 204 of the lever 602 defines a "belly" that contacts the load-bearing surface 114. The point of contact between the front side 204 of the lever 602 and the load-bearing surface 114 acts as a fulcrum for the lever 602.

As shown in FIG. 7, the shaft 501 of a tool (500) contacts the lever 602 when the shaft 501 is inserted into the aperture 215 of the first side 206 of the tray bed 201. In response to the shaft 501 pushing on the lever 602, the lever 602 rotates about the hinge 203. As the lever 602 rotates, it rolls along the load-bearing surface 114 defined by the extension member 110 extending from the major face 101 of the housing 100. As the lever 602 rolls, it receives a force from the load-bearing surface 114 that pushes back against the lever 602 at its point of contact with the load-bearing surface 114. The force on the lever 602 from the load-bearing surface 114 is transmitted by the lever 602 to the hinge 203. The hinge 203, in turn, pushes the tray bed 201 away from the housing 100.

As the lever 602, in response to the force applied by the shaft 501, pushes on the load-bearing surface 114 of the housing 100 for the SIM module, the load-bearing surface 114 pushes back on the lever 602 in accordance with Newton's third law of motion. The force of the load-bearing surface 114 pushing back on the lever 602 is transmitted by the lever 602 (the lever 602 being constructed of a rigid or semi-rigid material) to the hinge 203, which is connected to the tray bed 201. As the lever 602 rotates around the hinge 203, the lever 602 imparts the linear force on the hinge 203 that pushes open the tray bed 201 the hinge 203 is connected to.

In one or more embodiments, for the tray bed 201 to open, the force applied to the lever 602 by the shaft 501 is of sufficient magnitude to cause the force applied to the hinge 203 to overcome a retention force that initially holds the tray bed 201 in the closed position. Such retention forces can be applied by a clip or spring retention force applied to the tray bed 201 by the housing 100.

To aid in opening the tray bed 201, the lever 602 provides a mechanical advantage. In the closed position while the tray bed 201 is being held in place by the retention force, the force applied by the shaft 501 acts at a point located a first distance from the initial fulcrum point, while the force acting on the hinge 203 acts at a point located a second distance from the initial fulcrum point. Where the first distance is greater than the second distance, there is a force multiplier defined by the ratio of the first distance to the second distance, yielding a force applied to the hinge 203 that exceeds the force applied by the shaft 501. This multiplier makes it easier for a user of the device to overcome the retention force and open the tray bed 201. It also allows for the use of a smaller tool (500) to generate the force against the lever, which, in turn, allows for a smaller aperture 215 in the tray bed 201. For some embodiments, the initial fulcrum point is closer to the portion of the lever 602 at least partially covering the aperture 215 than to the hinge 203.

As the retention force (where present) is overcome and the tray bed 201 opens, the lever 602 is configured through its pivotal connection with the hinge 203 to roll along the convex curvature of its front side 204 against the load-bearing surface 114 extending from the housing 100 covering the SIM module itself. The left side of the lever 602 is pushed away from the front side 206 of the tray bed 201 by the force applied by the shaft 501, and the fulcrum point moves from the initial fulcrum point away from the hinge as the front side 204 of the lever 602 rolls along the load-bearing surface 114. As the force applied by the shaft 501 continues to push inward on the lever 602, the lever 602 continues to push outward on the hinge 203, which continues to push open the tray bed 201. When the tray bed 201 has been pushed a sufficient distance from the housing 100, this causes the front side 206 of the tray bed 201 to extend out of the electronic device housing in which the assembly 600 is situated. Accordingly, a user can then grip the tray bed 201 to fully remove it from the device housing.

Because the lever 602 is attached to the tray bed 201, it is ejected with the tray bed 201 when the user removes the tray bed 201 both from the housing 100 and the body of the electronic device in which the assembly 600 is situated. For this reason, in one or more embodiments the lever 602 fits completely behind the front side 206 of the tray bed 201. As noted above, the inclusion of the chamfer 603 assists in reinserting the tray bed 201 into the electronic device, as well as the housing 100, by reducing the chance of mechanical interference. Thus, in one or more embodiments the height of the lever 602 does not exceed the height of the front side 206 of the tray bed 201. Additionally, the lever's width does not exceed the width of the tray bed 201 in this embodiment. Locating the lever 602 behind the front side 206 of the tray bed 201 makes efficient use of volume and allows for a smaller form factor for the assembly 600.

As noted above, with prior art designs, mechanical walls extending from the body of the electronic device itself, generally manufactured from plastic, are required for any ejection mechanism. This often requires the front side of the tray bed to be extended to provide the traditional lever with access to the mechanical wall. Additionally, the height of both the lever and the tray bed must increase for sufficient contact to occur against the mechanical wall for proper ejection. The larger dimensions, in turn, results in a larger cavity within the traditional device. This is a disadvantage that embodiments of the disclosure overcome.

Figure 8:
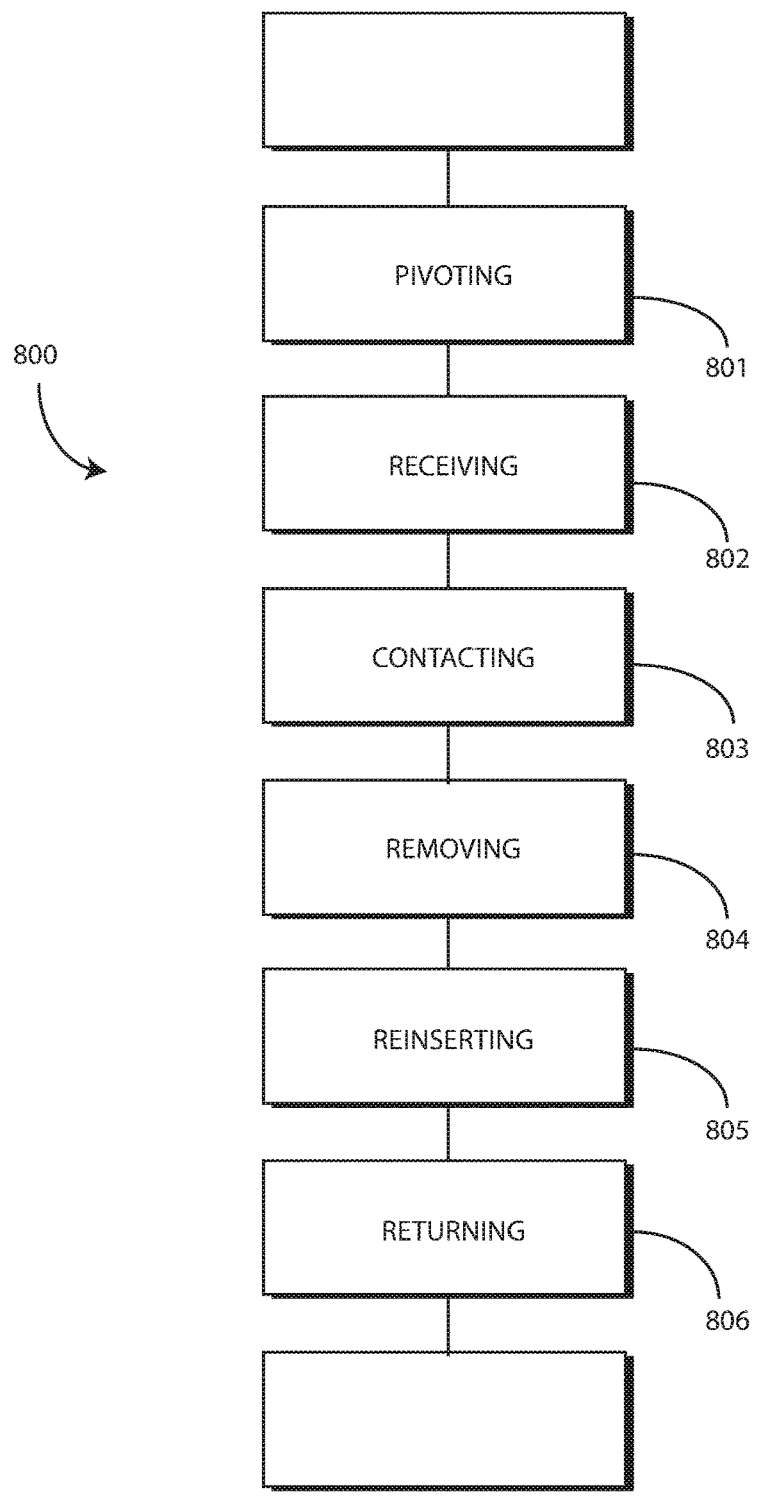
FIG. 8 illustrates one explanatory method in accordance with one or more embodiments of the disclosure.

To wit, embodiments of the disclosure provide an extension member that extends from a module housing, which is generally manufactured from metal, which is folded back upon the module housing to define a load bearing surface. Accordingly, no mechanical wall extending from the body of the electronic device is required. This results in the height of each of the lever and the front side of the tray bed being reduced—in many cases as much as by an amount exceeding 0.4 millimeters, which is a substantial amount in the world of portable electronics. This allows the overall electronic device to become thinner Turning now to FIG. 8, illustrated therein is one explanatory method 800 for using an apparatus configured in accordance with one or more embodiments of the disclosure.

Beginning at step 801, the method 800 comprises pivoting a lever coupled to a tray about a hinge. In one or more embodiments, step 801 comprises inserting the shaft of a tool through an aperture defined in a side of a tray. In one or more embodiments, the lever comprises a convex surface.

At step 802, the method 800 comprises receiving, at the lever, an actuation force. For example, where step 801 comprises inserting the shaft of a tool through an aperture defined in a side of a tray, step 802 can comprise receiving an actuation force to cause a pivoting action through the aperture defined in the end of the tray.

At step 803, the method 800 comprises contacting, with the lever during its pivoting, a load bearing surface of a metal module housing that is configured to shield a module, such as a SIM module, from electromagnetic radiation. In one or more embodiments, the load bearing surface is defined by an extension member that extends distally away from a top major face of the metal module housing when that extension member is folded back over an edge of the top major face of the metal module housing. In one or more embodiments, the contacting occurring at step 803 comprises rolling the convex surface of the lever along the load bearing surface.

At step 804, the method 800 comprises grasping the tray and removing it from the housing once the lever has sufficiently ejected the tray from the housing. At step 805, the method comprises reinserting the tray into the housing. As the tray slides into the housing, this causes the lever to return to an initial position occurring prior to the pivoting occurring at step 801 by sliding the tray into the cavity of the housing, as shown at step 806.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An apparatus, comprising:
   a housing comprising a major face defining a width of the housing, a first minor face extending distally from a first side of the major face, and a second minor face extending distally from a second side of the major face, the major face, the first minor face, and the second minor face defining an opening of the housing; and
   an extension member extending distally from the major face between the first minor face and the second minor face, the extension member defining an extension member width that is less than the width of the housing, wherein the extension member is folded back over an edge of the major face to define a load bearing surface extending beyond a perimeter of the major face.

2. The apparatus of claim 1, the first minor face and the second minor face extending substantially orthogonally from the major face.

3. The apparatus of claim 1, wherein the extension member extends distally from the major face along a plane defined by the major face, further wherein a tangent of the load bearing surface is oriented substantially orthogonally with the plane defined by the major face.

4. The apparatus of claim 3, wherein the housing is manufactured from metal.

5. The apparatus of claim 3, wherein the load bearing surface is convex.

6. The apparatus of claim 5, wherein at least another portion of the load bearing surface is convex.

7. The apparatus of claim 6, wherein the load bearing surface defines at least one recess disposed between the at least a portion and the at least another portion.

8. The apparatus of claim 7, further comprising a substrate coupled to the first minor face and the second minor face.

9. The apparatus of claim 3, wherein at least a portion of the load bearing surface is planar.

10. The apparatus of claim 9, wherein the load bearing surface is offset from the edge of the major face.

11. An apparatus, comprising:
    a housing comprising a major face, a first minor face extending distally from a first side of the major face, and a second minor face extending distally from a second side of the major face;
    an extension member extending distally from an edge of the major face and folded back over the edge of the major face to define a load bearing surface;
    a tray configured for slidable insertion within a cavity of the housing defined by the major face, the first minor face, and the second minor face; and
    a lever coupled to the tray by a hinge;
    wherein the lever is configured to pivot about the hinge away from an end of the tray against the load bearing surface to slideably remove the tray from the cavity of the housing.

12. The apparatus of claim 11, the lever comprising a front side and a back side, wherein the back side of the lever defines a convex curvature.

13. The apparatus of claim 12, wherein the convex curvature is configured to roll along the load bearing surface when the lever pivots about the hinge away from the end of the tray.

14. The apparatus of claim 13, wherein the back side further defines a surface that is orthogonal with the back side, the surface disposed opposite the lever from the hinge.

15. The apparatus of claim 13, wherein the hinge is disposed at a first side of the end of the tray, further wherein the end of the tray defines an aperture through which a shaft can be inserted to pivot the lever about the hinge.

16. The apparatus of claim 15, wherein the tray comprises a receiver for a subscriber identification module.

17. A method, comprising:
    pivoting a lever coupled to a tray about a hinge;
    contacting, with the lever during the pivoting, a load bearing surface of a housing defined by an extension member extending distally from a major face of the housing and folded back over an edge of the major face; and
    removing, in response to the contacting, the tray from the housing.

18. The method of claim 17, wherein the lever comprises a convex surface, further wherein the contacting comprises rolling the convex surface along the load bearing surface.

19. The method of claim 18, further comprising, receiving, at the lever, an actuation force through an aperture in an end of the tray.

20. The method of claim 18, further comprising returning the lever to an initial position occurring prior to the pivoting by sliding the tray into a cavity of the housing.

\* \* \* \* \*